(12) United States Patent
Adams et al.

(10) Patent No.: US 9,209,606 B2
(45) Date of Patent: Dec. 8, 2015

(54) SEMICONDUCTOR OPTICAL AMPLIFIER

(71) Applicant: Finisar Sweden AB, Jarfalla (SE)

(72) Inventors: Dave Adams, Stockholm (SE); Jan-Olof Wesstrom, Stockholm (SE)

(73) Assignee: FINISAR SWEDEN AB, Jarfalla (SE)

( * ) Notice: Subject to any disclaimer, the term of this patent is extended or adjusted under 35 U.S.C. 154(b) by 9 days.

(21) Appl. No.: 14/025,083

(22) Filed: Sep. 12, 2013

(65) Prior Publication Data

US 2014/0362433 A1 Dec. 11, 2014

(30) Foreign Application Priority Data

Jun. 10, 2013 (SE) ........................................ 1350700

(51) Int. Cl.
*H01S 5/50* (2006.01)
*H01S 5/026* (2006.01)
*H01S 5/042* (2006.01)

(52) U.S. Cl.
CPC .................. *H01S 5/50* (2013.01); *H01S 5/0265* (2013.01); *H01S 5/0425* (2013.01)

(58) Field of Classification Search
CPC ......... H01S 5/50; H01S 5/0265; H01S 5/204; H01S 5/0425
See application file for complete search history.

(56) References Cited

U.S. PATENT DOCUMENTS

| 5,539,571 A * | 7/1996 | Welch et al. ................. 359/344 |
| 5,652,807 A * | 7/1997 | Fukuchi ........................... 385/3 |
| 6,334,005 B1 * | 12/2001 | Burie et al. ....................... 385/3 |
| 6,985,648 B2 * | 1/2006 | Kish et al. ....................... 385/14 |
| 7,539,378 B2 * | 5/2009 | Takabayashi et al. .......... 385/40 |
| 7,633,988 B2 * | 12/2009 | Fish et al. ................... 372/50.22 |

FOREIGN PATENT DOCUMENTS

JP 2013080011 A * 5/2013

OTHER PUBLICATIONS

Kudo et al. "1.55-micron Wavelength-Selectable Microarray DFB-LD's with Monolithically Integrated MMI Combiner, SOA, and EA-Modulator", IEEE Photonics Technology Letters, vol. 12, No. 3, pp. 242-244 (2000).*

* cited by examiner

*Primary Examiner* — Eric Bolda
(74) *Attorney, Agent, or Firm* — Young & Thompson

(57) ABSTRACT

One or more input access waveguides are connected to an optical splitter arranged to divide the light into two or more output waveguides, at least two of the splitter's output access waveguides are used to form a Mach-Zehnder interferometer modulator where at least one arm of the interferometer has a phase modulator electrode and a single electrical contact is arranged to apply a common voltage simultaneously to a selected portion in each arm, or selected portions in each arm of the waveguides that are disposed after the splitter but preceding the phase modulation electrodes, or alternatively the single electrical contact is arranged to apply the voltage to a selected portion of the input access waveguide connected to the splitter and in one or more selected portions of one or both of the arms after the splitter but preceding the phase modulation electrodes to provide gain or reduced optical loss.

20 Claims, 7 Drawing Sheets

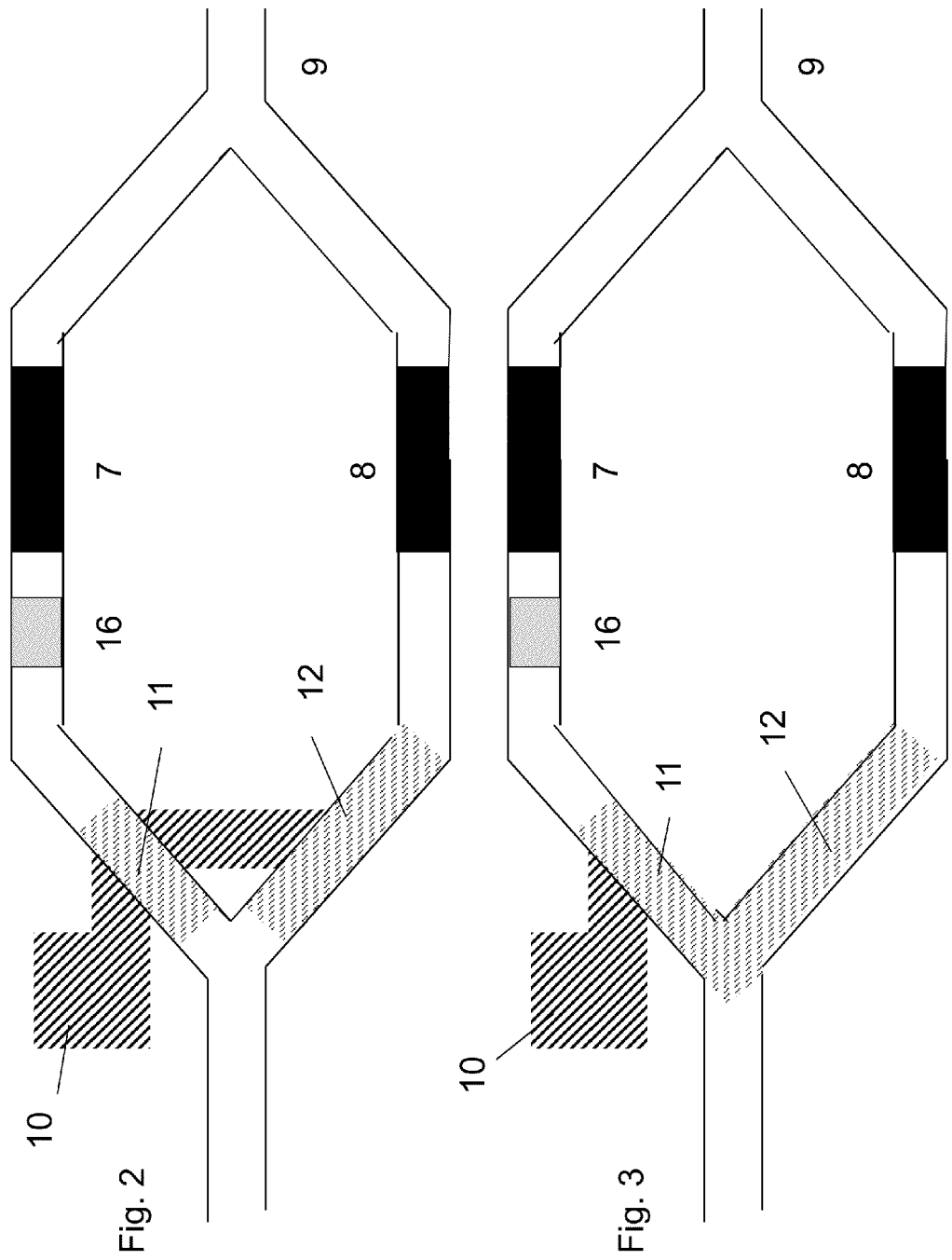

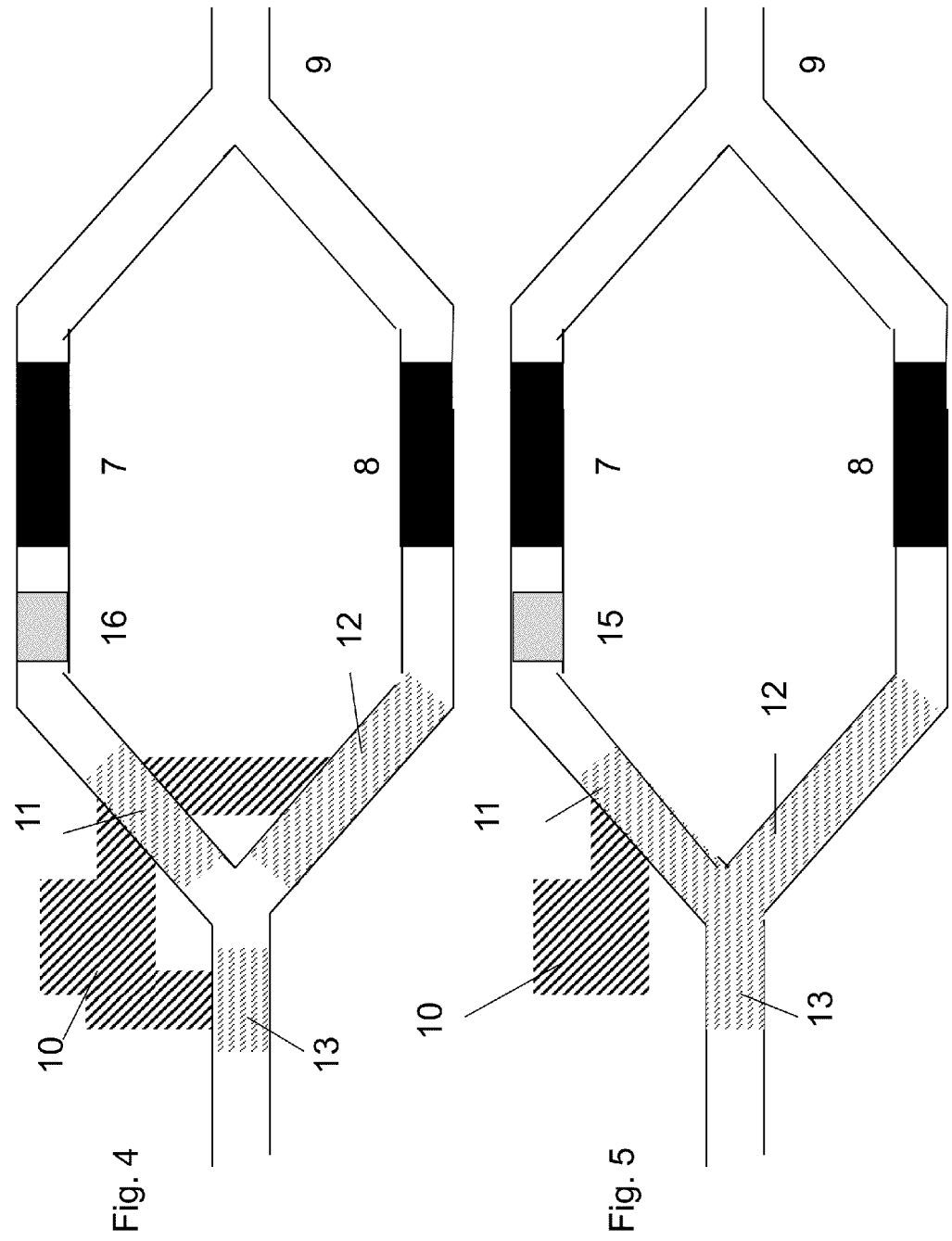

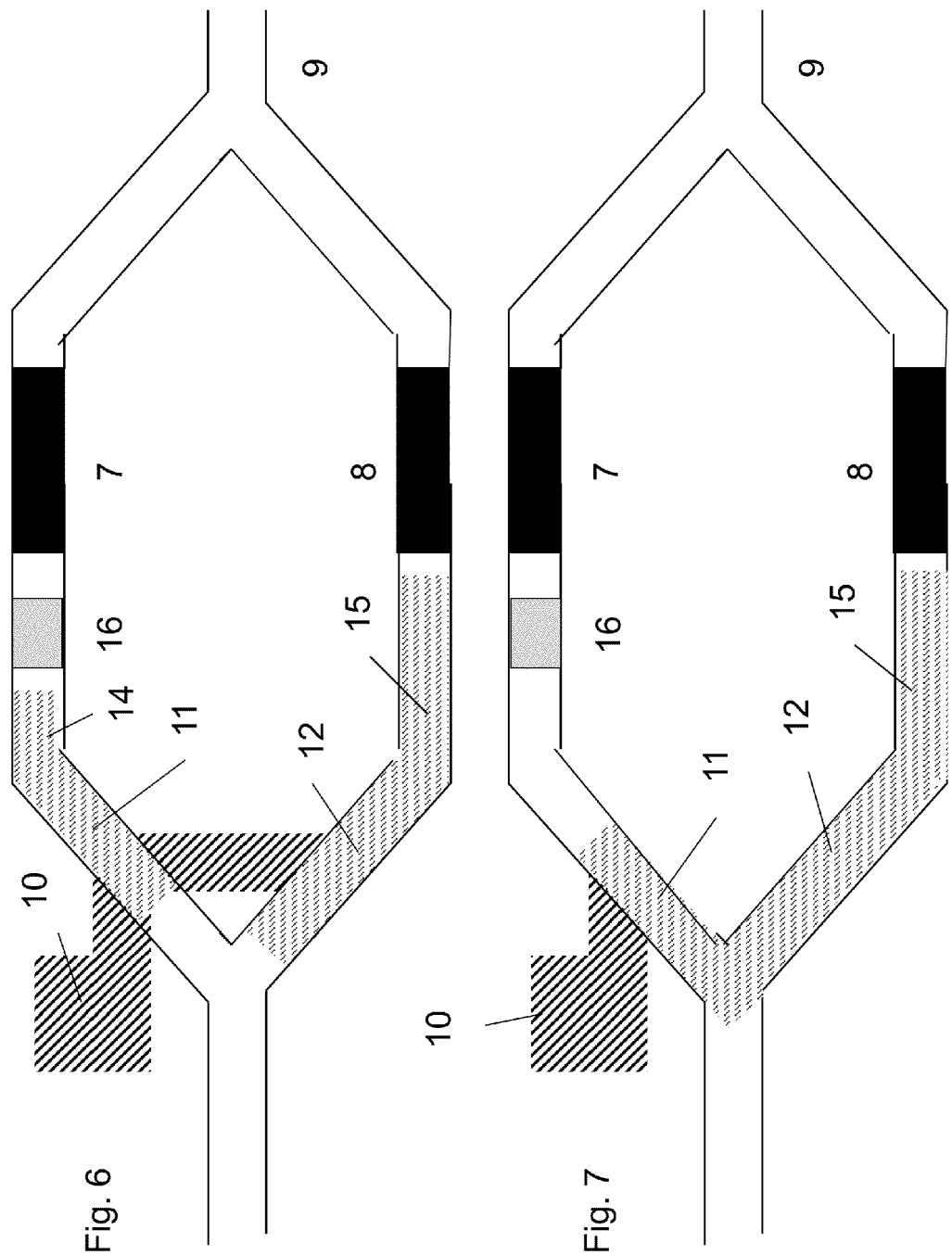

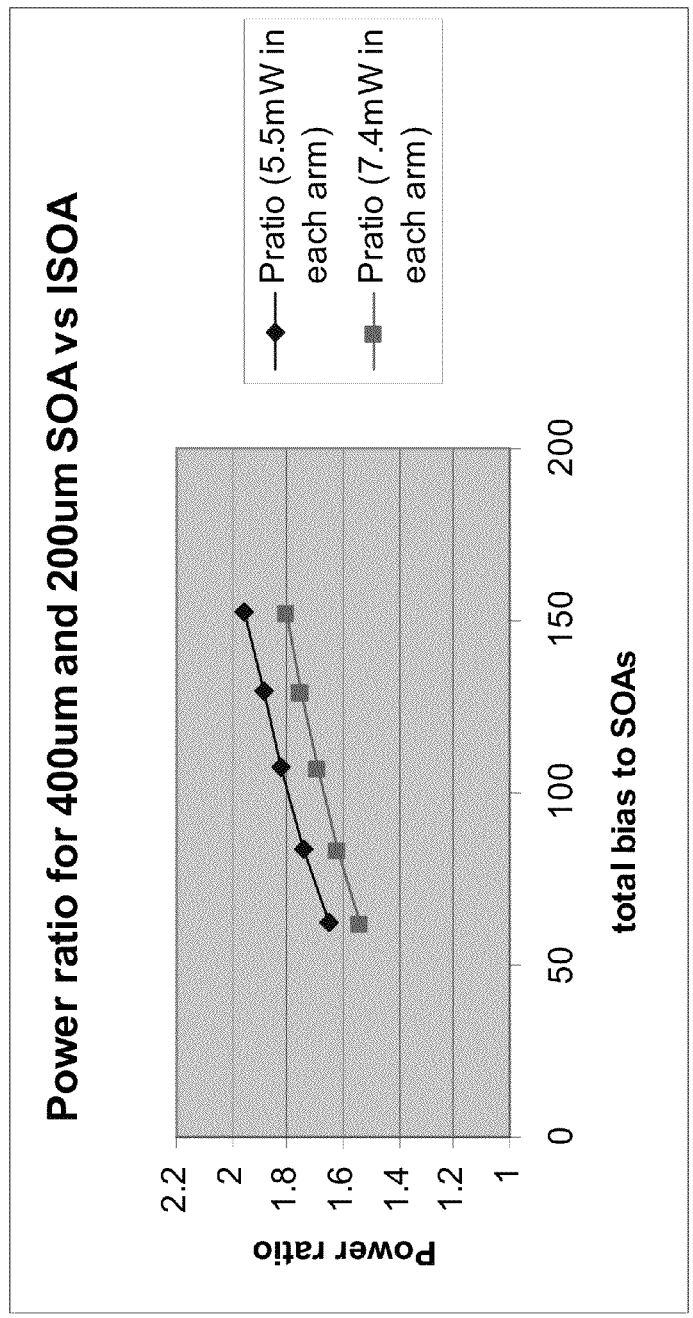

SEMICONDUCTOR OPTICAL AMPLIFIER

FIELD OF THE INVENTION

The present invention refers to a semiconductor optical amplifier.

BACKGROUND OF THE INVENTION

It is beneficial to equip opto-electronic circuits with a means to adjust the signal intensity within the circuit and/or at the output of the circuit. A power-adjust capability is useful to compensate either for unwanted optical losses within the circuit, to compensate for the ageing of the optical source(s) within or external to the circuit, and/or to adjust the output power level of the circuit.

One method to enable adjustments to the strength of an optical signal within or at the output of an optical circuit, is to dispose a semiconductor optical amplifier (SOA) somewhere along a light path within or at the output of the optical circuit. This approach can be used in optical circuits that comprise an assembly of discrete components, a hybrid assembly combining discrete and monolithically integrated components, or a fully monolithically integrated optical circuit.

The present invention relates to the particular application of the amplification of light prior to the input of the light into a Mach-Zehnder (MZ) optical modulator or switch, and more specifically to the case where an SOA is monolithically integrated with a Mach-Zehnder modulator. Previous workers have placed a SOA either along the access waveguide leading to the input of the modulator, or have placed one SOA in each arm of a MZ modulator or switch.

The SOA's thus configured can provide the general benefits to the optical circuit of optical power adjustment, as described earlier. In the particular configuration where a SOA is placed in each arm of a MZ modulator, it is then possible to adjust the gain of each SOA and thereby adjust the ratio of the power in the two arms of the MZ interferometer. It has been shown that an unequal division of input power in the arms of the MZ can be beneficial to transmission performance over fibre.

However the placement of a SOA before a Mach-Zehnder, or the placement of a SOA in each arm of a Mach-Zehnder, introduces some drawbacks.

First, the addition of a SOA either before a Mach Zehnder, or the addition of a SOA in each arm of a Mach-Zehnder, increases the size of the optical circuit.

Secondly, the placement of a SOA before a MZ can degrade the performance of the circuit, because spontaneous emission noise that is generated within the SOA can reach other parts of the optical circuit, particularly in the case where the SOA and MZ are integrated with a laser for example.

The placement of one SOA in each arm of a Mach-Zehnder interferometer enables the adjustment of the ratio of the power in the two arms. However if the bias voltage that must be supplied to the two SOAs is unequal, then the requirement for a circuit that divides the bias current between the two SOAs unequally, or the requirement for an additional current source so that each SOA can be biased independently, introduces extra assembly and parts cost, and may also increase the overall size and power dissipation of the circuit.

The invention disclosed here either eliminates or reduces the severity of all the drawbacks described here.

SUMMARY OF THE INVENTION

The present invention thus refers to a semiconductor optical amplifier (SOA) which is monolithically integrated with a Mach-Zehnder modulator, characterized in, that one or more input access waveguides are connected to an optical splitter, such as a Y-branch type, a directional coupler, or a 1×N or N×N Multi-Mode-Interference MMI, that is arranged to divide the light into two or more output waveguides, in that at least two of the splitter's output access waveguides are used to form a Mach-Zehnder interferometer modulator where at least one arm of the interferometer has a phase modulator electrode and in that a single electrical contact is arranged to apply a common voltage simultaneously to a selected portion in each arm, or selected portions in each arm of the waveguides that are disposed after the splitter but preceding the phase modulation electrodes, or alternatively that said single electrical contact is arranged to apply said voltage to a selected portion of the input access waveguide connected to said splitter and in one or more selected portions of one or both of said arms after the splitter but preceding the phase modulation electrodes to provide gain or reduced optical loss.

BRIEF DESCRIPTION OF THE DRAWINGS

The invention is more closely described below, partly in connection with different exemplifying embodiments shown in the attached drawings, where FIGS. 2-9 show different embodiments of the present invention FIG. 10 is a diagram.

DETAILED DESCRIPTION OF THE INVENTION

The invention relates to monolithically integrated opto-electronic circuits, and more specifically to a SOA that is monolithically integrated with a Mach-Zehnder modulator.

Figure 1:
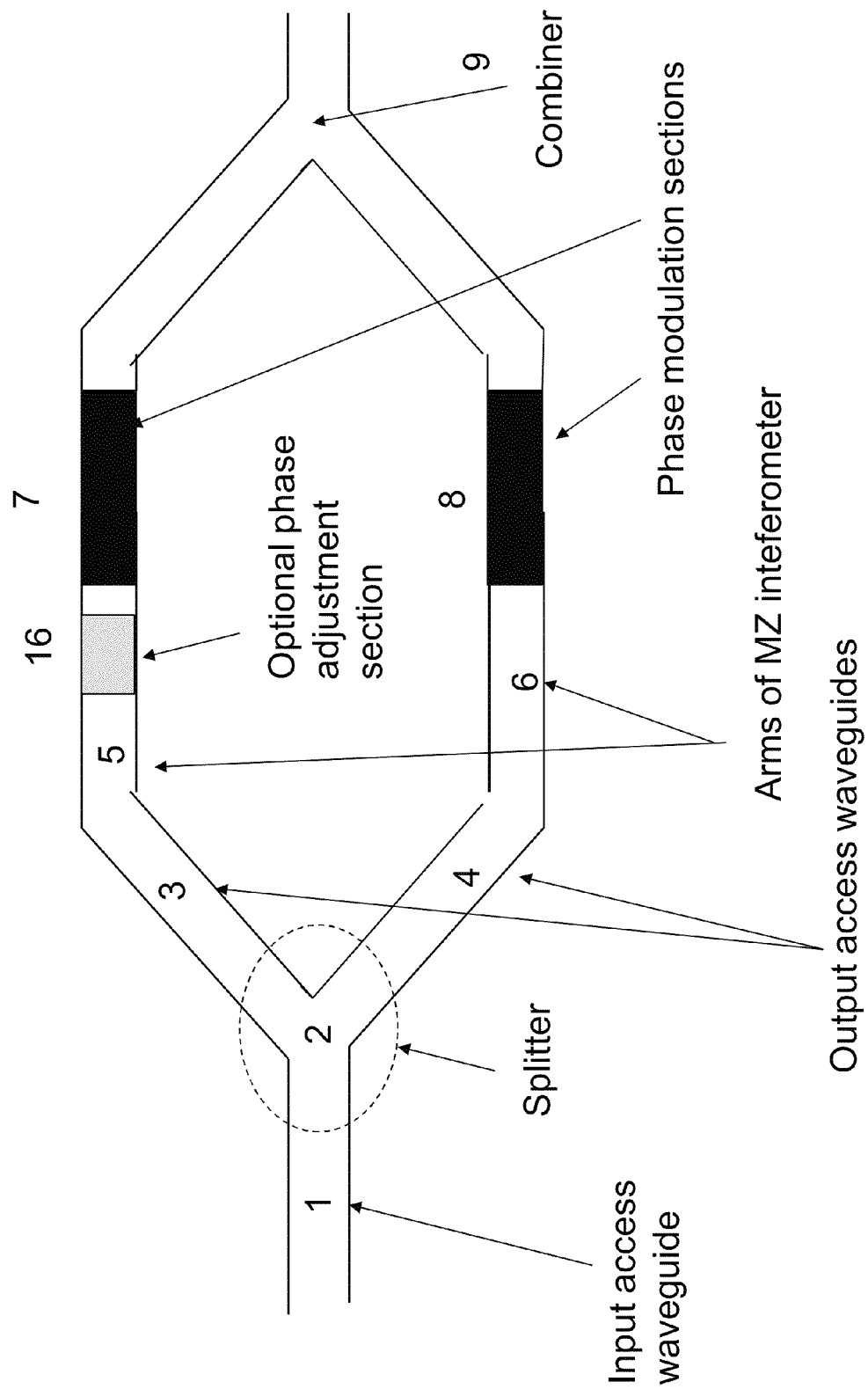
FIG. 1 is a drawing illustrating the principle of the present invention

FIG. 1 illustrates the basic elements of an optical splitter that can be used at the input terminal of a Mach-Zehnder interferometer.

In FIG. 1 reference numeral 1 designates an input access waveguide, reference numeral 2 designates a splitter, 3 and 4 designate output access waveguides, 5 and 6 designate the respective arms of a Mach-Zehnder Interferometer, 7 and 8 designate phase modulation sections, 9 designates a combiner and 16 designates an optional phase adjustment section.

According to the invention one or more input waveguides 1 are connected to an optical splitter 2, such as a Y-branch type, a directional coupler, or a 1×N or N×N Multi-Mode-Interference MMI, that is arranged to divide the light into two or more output waveguides 3, 4. At least two of the splitter's output waveguides 3, 4 are used to form a Mach-Zehnder interferometer modulator having two arms 5, 6 where at least one of the two arms has a phase modulator electrode 7, 8. A semiconductor optical amplifier (SOA) is monolithically integrated with the Mach-Zehnder modulator.

A single electrical contact 10 is arranged to apply a common voltage to a selected portion or selected portions 11, 12 of one or more of the waveguides that are disposed after the splitter but preceding the phase modulation electrode(s) 7, 8 or alternatively that said single electrical contact is arranged to apply said voltage to a selected portion 13 of the input access waveguide 1 connected to said splitter and in one or more selected portions 11 of one or both of said arms after the splitter 2 but preceding the phase modulation electrodes to provide gain or reduced optical loss.

According to one embodiment said selected portion or selected portions comprises the splitter 2.

According to another embodiment said selected portion or selected portions comprises the input or output access waveguide(s) 3, 4 of the splitter.

According to still another embodiment that said selected portion or selected portions comprises one or two of said two arms of the Mach-Zehnder modulator.

Said embodiments may be combined. This is illustrated in the FIGS. 2-9. In all Figures the same reference numeral is used to designate the same or corresponding element.

In FIG. 2 the selected portions 11, 12 are located in the output access waveguides 3, 4.

The selected portions comprise a layer of electrically conductive material.

In FIG. 3 the selected portions 11, 12 also comprise a part of the splitter.

In FIG. 4 the selected portions also comprises a part 13 of the input access waveguide but not the splitter.

In FIG. 5 the selected portions comprise the input access waveguide as well as the output access waveguides and the splitter.

As can be seen from FIGS. 2-5 the selected portion in the respective output access waveguides have different lengths.

In FIG. 6 the selected portions 11, 12 comprise parts 14, 15 of both of said arms.

In FIG. 7 the selected portions 11, 12 comprise both input access waveguides and a part 15 of one of said arms only.

Figure 8:
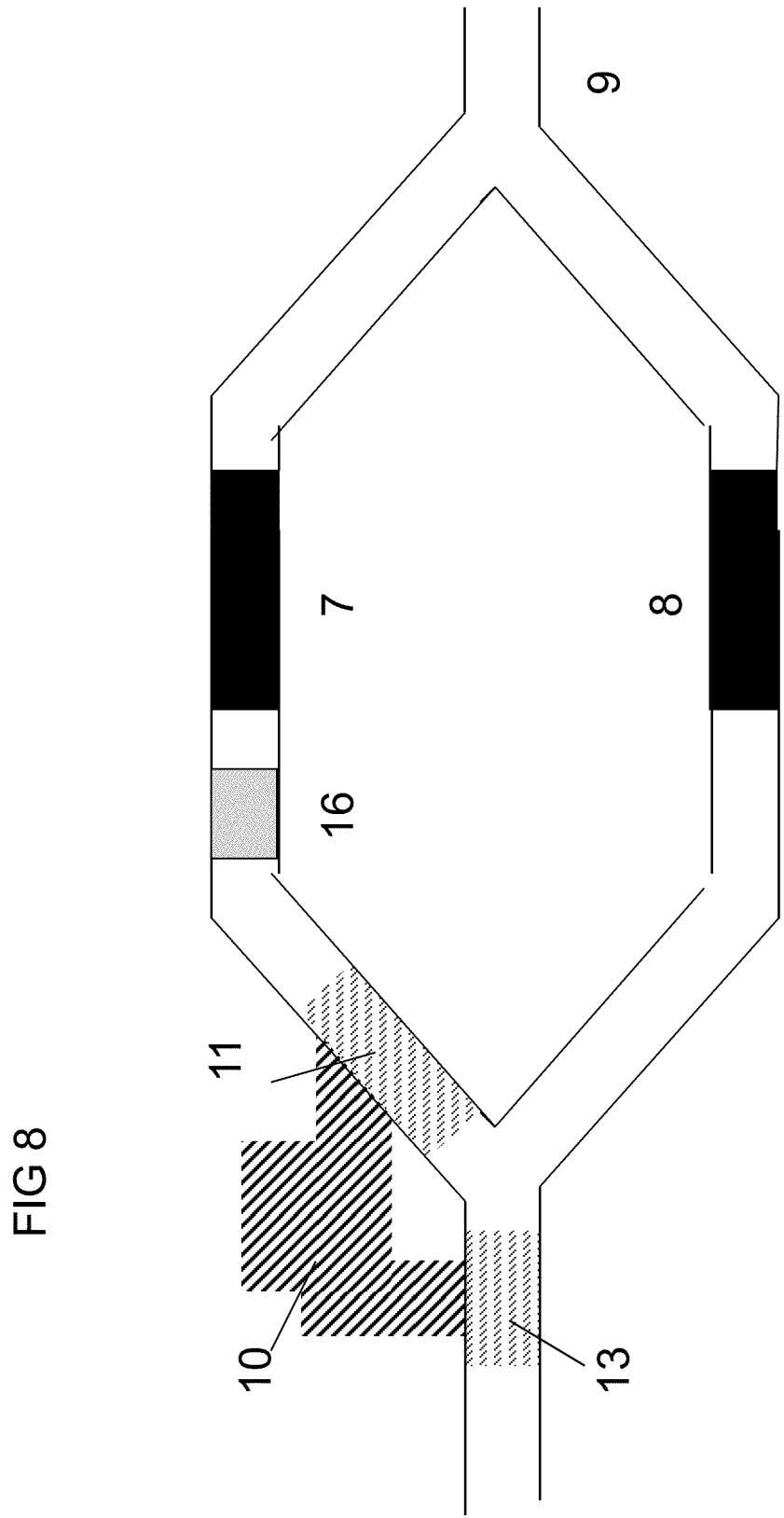

In FIG. 8 the selected portions 11, 13 comprise both said input access waveguide and a part 15 of one of said output access waveguides.

Figure 9:
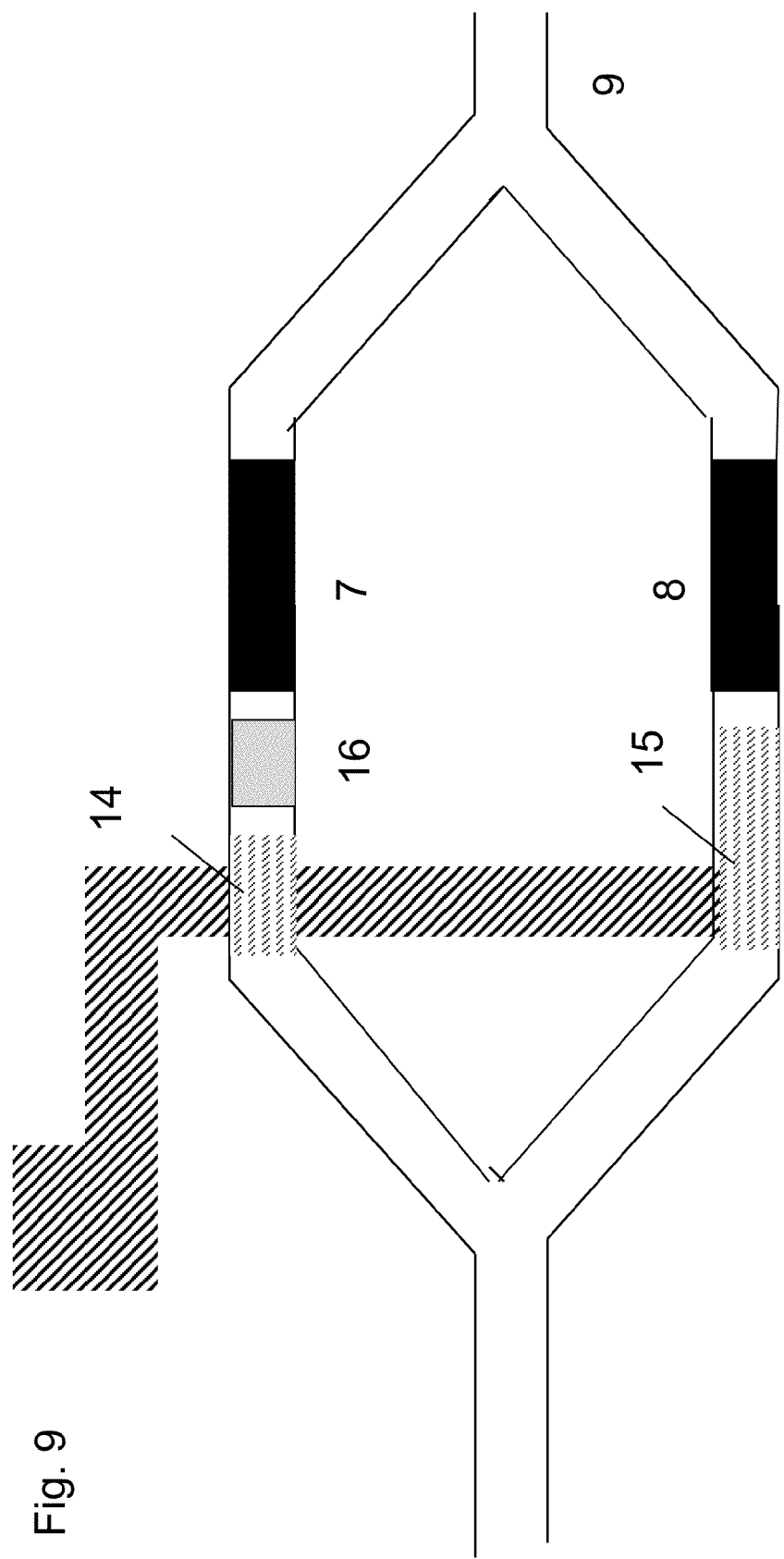

In FIG. 9 the selected portions comprise unequal lengths of said arms.

It is apparent that many combinations of the said selected portions can be made. The man skilled in the art has no difficulty in proposing other combinations than those shown in the attached Figures.

According to a preferred embodiment the amplifier SOA is arranged such that the output access waveguides 3, 4 are unequally amplified.

In all embodiments in FIGS. 2 to 9, the selected portions have a different size such that the power launched in the two phase modulation sections of said arms will be substantially unequal.

According to the invention, one or more input waveguides is connected to an optical splitter, which may be a Y-branch type, a directional coupler, or a 1×N or N×N Multi-Mode-Interference MMI, that divides the light into two or more output waveguides.

In a preferred embodiment of the invention, the combined length of the amplifying sections in a first output access waveguide and in the waveguide of the Mach-Zehnder arm that is connected to that first output access waveguide, is substantially unequal to the combined length of the amplifying sections in a second output access waveguide and in the waveguide of the Mach-Zehnder arm that is connected to the output of the second access waveguide.

In another embodiment, the length of the amplifying section in the two access waveguides at the output of the splitter, or in the arms that will form the Mach-Zehnder interferometer, is substantially equal, but the power entering the phase modulation section in a first arm of the interferometer can be made substantially unequal to the power entering the phase modulation section in the second arm, due to one or a combination two or more of the following differences between portions of the output access waveguides and/or due to differences between the portions of waveguides of the interferometer that precede the phase modulation sections, namely a difference in optical confinement or waveguide width, a difference in the width of the metal or semiconductor layers that form the electrical contact, a difference in output access waveguide bend loss, a difference in passive optical losses due to doping or implants, a difference in parasitic losses due to the proximity of metal contacts, or a difference in gain due to difference of volume or alloy composition of the gain material.

In all embodiments, an optional phase adjust section is provided in one modulator arm, which can be used to maintain a desired total phase difference between the two arms in the absence of high speed modulation, and which may for example be used to compensate for differences in phase between the Mach-Zehnder arms as the SOA current is varied. The addition of a phase adjust section can enable greater independence between the selection of the gain that is provided by the SOA and the selection of the phase difference between the arms when compared to the case of maintaining a fixed phase difference and a changing output power with two SOA's that are biased independently. A phase adjust section is not strictly required in all cases, because changes in the DC bias of the Mach-Zehnder arms can, in some cases, be sufficient to mitigate changes in the phase difference between the arms of the interferometer that might arise due to changes in the SOA bias. The phase adjust section can be additionally beneficial in that it may compensate for unintentional optical path length differences between the arms during manufacture.

By way of example, FIG. 10 illustrates a calculation of the ratio of power entering the arms of a Mach-Zehnder vs. the total current bias that is applied to a SOA, where said SOA consists of two gain sections, a gain section having length of 200 um in a first Mach-Zehnder waveguide arm and 400 um in the second arm, and where the 200 um and 400 um gain sections are joined with a common electrical contact layer. The input power in each arm of the Mach-Zehnder is assumed to be equal to 5.5 mW in the highest curve and 7.4 mW in the lower curve. It can be seen that the ratio of the power in the two arms varies by approximately 10% when the bias current to the SOA varies between 100 mA and 150 mA, and that the ratio changes by approximately 10% when the input power is increase by 30%. Such a variation in the ratio of the power emission is acceptable to enable transmission performance with less than 1.5 dB link penalty over 90 km of NDSF.

Optionally the input optical power to the Mach Zehnder and/or the bias on the SOA contact can be changed to intentionally alter the ratio of power in the two arms of the Mach Zehnder, in order to favorably tune the optical signal transmission over fibre, or to achieve other advantages in the operation of the optical integrated circuit. Accordingly the configuration described in these embodiments can provide some degree of tunable power splitting.

In yet another example of the operation of the chip, the optical power launched into the input waveguide of the MZ and the bias that is applied to the common SOA contact over the MZ arms can both be changed, in such a way that the total sum of the optical power that is injected into the two arms remains constant, but where the ratio of power in the two Mach Zehnder arms is changed. This method of altering the device settings while keeping a constant optical output power may allow an adjustment of the chip output for more favourable transmission performance and/or some other optical circuit performance or lifetime reliability benefit.

The invention provides a number of advantages.

First of all, the use of a single electrical contact to achieve an unequal amplification of light into the two arms of the interferometer will reduce the cost and size of the circuit when compared with circuits that require two or more SOA bias currents.

Secondly, by making dual use of the splitter (consisting of the input access waveguide, the splitter, and the output access waveguides) to both split and amplify the light at the same time, the size of the optical circuit can be reduced when compared with prior art embodiments.

Thirdly, for the particular case of the integration of the SOA and Mach-Zehnder with a laser source, an additional advantage of placing the SOA as proposed in this invention rather than placing the SOA entirely before the Mach-Zehnder, is that any optical reflection from the splitter can be made to occur after a shorter distance from the laser, and with reduced two-pass amplification. Reflections of reduced amplitude, and at shorter distances to the laser, can in some cases be less detrimental to the emission properties of a laser that has been designed to operate in the absence of reflections.

In a fourth instance, when compared with the placement of a SOA in between a laser source and the Mach-Zehnder modulator, all embodiments that include some portion of the optical amplification within the output access waveguides of the Mach-Zehnder modulator, or in the arms of the Mach-Zehnder modulator, will benefit from a reduced efficiency of the coupling of the spontaneous emission from the SOA to other parts of the circuit, because the spontaneous noise that is generated in each arm is uncorrelated in phase with the spontaneous emission in the other arm, and this reduces the throughput of said spontaneous emission from the arms of the Mach-Zehnder modulator into the remainder of the circuit.

This reduction in spontaneous emission can benefit the side mode suppression ratio of a single mode laser source that is integrated with the SOA and Mach-Zehnder modulator, for example. In configurations where the SOA described in this invention includes a portion of its length situated prior to the splitter, and some portions of its length in the output access waveguides or waveguide arms beyond the splitter as shown in FIGS. 4, 5, 10, 11, 12, the backward travelling ASE will also be reduced when compared to the case of a SOA with the same design of the gain waveguide that lies entirely before the splitter, assuming a given value of the total amplified power after the SOA.

In a fifth instance, the greater volume of SOA material leads to operation of the circuit with reduced current density for a given target output power, leading to reduced current density operation and therefore greater anticipated long term reliability of the circuit.

In a sixth instance, by maintaining a waveguide splitter design having geometrical symmetry, avoids possible additional excess optical splitting losses, and to avoid non-idealities in reflection from the splitter, or in the splitting ratio itself, that might arise due to any manufacturing difficulties that are associated with the construction of a splitter that employs an asymmetry in the waveguide geometry to achieve unequal power splitting.

In a seventh instance, embodiments where the SOA regions are situated in both output access waveguides and/or both output arms, where each arm receives approximately half of the incoming optical intensity, the SOA will have approximately double the optical power handling capability when compared to a SOA that is placed before the splitter, when the SOA electrode is grounded or reverse biased to attenuate the optical power.

Some of the prior art provides a subset of the advantages described above, but none of the embodiments in the prior art can provide all of these advantages at the same time.

The present invention can be varied as stated above, as regards the said selected portions as well as regards the shape and properties of the said electrical contact, without departing from the inventive idea.

Thus, the present invention shall not be restricted to the embodiments presented above, but can be varied within the scope of protection of the claims.

The invention claimed is:

1. A semiconductor optical amplifier (SOA) which is monolithically integrated with a Mach-Zehnder modulator, comprising:
   one or more input access waveguides connected to an optical splitter or a Y-branch optical splitter;
   a directional coupler, or a 1×N or N×N Multi-Mode-Interference MMI, that is arranged to divide light into two or more output waveguides, and at least two of the splitter's output access waveguides form a Mach-Zehnder interferometer modulator where at least one arm of the interferometer has a phase modulator electrode; and
   a single electrical contact arranged to apply a common voltage simultaneously to a selected portion in each arm, or selected portions in each arm of the waveguides that are disposed after the splitter but preceding the phase modulation electrodes, or alternatively said single electrical contact is arranged to apply said voltage to a selected portion of the input access waveguide connected to said splitter and in one or more selected portions of one or both of said arms after the splitter but preceding the phase modulation electrodes to provide gain or reduced optical loss.

2. The semiconductor optical amplifier according to claim 1, wherein the semiconductor optical amplifier is arranged such that the output access waveguides are unequally amplified.

3. The semiconductor optical amplifier according to claim 1, wherein an optional phase adjust section is provided in at least one modulator arm of the Mach-Zehnder modulator, which adjust section can be used to maintain a desired total phase difference between the two arms in the absence of high speed modulation.

4. The semiconductor optical amplifier according to claim 1, wherein said selected portion or selected portions preceding the phase modulation electrodes and adjacent the splitter is or are at least part of the splitter.

5. The semiconductor optical amplifier according to claim 1, wherein said selected portion or selected portions preceding the phase modulation electrodes and adjacent the splitter is or are at least part of the input or output access waveguide(s) of the splitter.

6. The semiconductor optical amplifier according to claim 1, wherein said selected portion or selected portions comprises/comprise one or two of said two arms of the Mach-Zehnder modulator in a portion of said arm/arms that precedes the phase modulation electrodes and in that the selected portions have a different size such that the power launched in the two phase modulation sections of said arms will be substantially unequal.

7. The semiconductor optical amplifier according to claim 1, wherein a combined length of the amplifying sections in a first output access waveguide and in the waveguide of the MZ arm that is connected to that first output access waveguide, is substantially unequal to the combined length of the amplifying sections in a second output access waveguide and in the waveguide of the Mach-Zehnder arm that is connected to the output of the second access waveguide.

8. The semiconductor optical amplifier according to claim 1, wherein a length of the amplifying section in the two access waveguides at the output of the splitter, or in said arms is substantially equal, said selected portion or selected portions are different from each other such that the power entering the phase modulation section in a first of said arms of the interferometer is substantially unequal to the power entering the phase modulation section in the second of said arms, due to one or a combination two or more of the following differences between portions of the output access waveguides and/or due differences between the portions of waveguides of the interferometer that precede the phase modulation sections, namely a difference in optical confinement or waveguide width, a difference in the width of the metal or semiconductor layers that form the electrical contact, a difference in output access waveguide bend loss, a difference in passive optical losses due to doping or implants, a difference in parasitic losses due to the proximity of metal contacts, or a difference in gain due to difference of volume or alloy composition of the gain material.

9. The semiconductor optical amplifier according to claim 1, wherein a laser is integrated with the semiconductor optical amplifier and the Mach-Zehnder modulator.

10. The semiconductor optical amplifier according to claim 2, wherein an optional phase adjust section is provided in at least one modulator arm of the Mach-Zehnder modulator, which adjust section can be used to maintain a desired total phase difference between the two arms in the absence of high speed modulation.

11. The semiconductor optical amplifier according to claim 2, wherein said selected portion or selected portions preceding the phase modulation electrodes and adjacent the splitter is or are at least part of the splitter.

12. The semiconductor optical amplifier according to claim 2, wherein said selected portion or selected portions preceding the phase modulation electrodes and adjacent the splitter is or are at least part of the input or output access waveguide(s) of the splitter.

13. The semiconductor optical amplifier according to claim 2, wherein said selected portion or selected portions comprises/comprise one or two of said two arms of the Mach-Zehnder modulator in a portion of said arm/arms that precedes the phase modulation electrodes and in that the selected portions have a different size such that the power launched in the two phase modulation sections of said arms will be substantially unequal.

14. The semiconductor optical amplifier according to claim 2, wherein a combined length of the amplifying sections in a first output access waveguide and in the waveguide of the MZ arm that is connected to that first output access waveguide, is substantially unequal to the combined length of the amplifying sections in a second output access waveguide and in the waveguide of the Mach-Zehnder arm that is connected to the output of the second access waveguide.

15. The semiconductor optical amplifier according to claim 2, wherein a length of the amplifying section in the two access waveguides at the output of the splitter, or in said arms is substantially equal, in that said selected portion or selected portions are different from each other such that the power entering the phase modulation section in a first of said arms of the interferometer is substantially unequal to the power entering the phase modulation section in the second of said arms, due to one or a combination two or more of the following differences between portions of the output access waveguides and/or due differences between the portions of waveguides of the interferometer that precede the phase modulation sections, namely a difference in optical confinement or waveguide width, a difference in the width of the metal or semiconductor layers that form the electrical contact, a difference in output access waveguide bend loss, a difference in passive optical losses due to doping or implants, a difference in parasitic losses due to the proximity of metal contacts, or a difference in gain due to difference of volume or alloy composition of the gain material.

16. The semiconductor optical amplifier according to claim 2, wherein a laser is integrated with the semiconductor optical amplifier and the Mach-Zehnder modulator.

17. The semiconductor optical amplifier according to claim 3, wherein said selected portion or selected portions preceding the phase modulation electrodes and adjacent the splitter is or are at least part of the splitter.

18. The semiconductor optical amplifier according to claim 3, wherein said selected portion or selected portions preceding the phase modulation electrodes and adjacent the splitter is or are at least part of the input or output access waveguide(s) of the splitter.

19. The semiconductor optical amplifier according to claim 3, wherein said selected portion or selected portions comprises/comprise one or two of said two arms of the Mach-Zehnder modulator in a portion of said arm/arms that precedes the phase modulation electrodes and in that the selected portions have a different size such that the power launched in the two phase modulation sections of said arms will be substantially unequal.

20. The semiconductor optical amplifier according to claim 3, wherein the combined length of the amplifying sections in a first output access waveguide and in the waveguide of the Mach-Zehnder arm that is connected to that first output access waveguide, is substantially unequal to the combined length of the amplifying sections in a second output access waveguide and in the waveguide of the Mach-Zehnder arm that is connected to the output of the second access waveguide.

* * * * *